United States Patent
Keyrouz et al.

[11] Patent Number: 5,617,510
[45] Date of Patent: Apr. 1, 1997

[54] DEPENDENCY GRAPH SOLUTION FOR CONSTRAINT SYSTEMS

[75] Inventors: Walid T. Keyrouz; Glenn A. Kramer; Jahir A. Pabon, all of Austin, Tex.

[73] Assignee: Schlumberger Technology Corporation, Austin, Tex.

[21] Appl. No.: 420,618

[22] Filed: Apr. 12, 1995

Related U.S. Application Data

[63] Continuation of Ser. No. 53,891, Apr. 27, 1993, abandoned, which is a continuation-in-part of Ser. No. 979,143, Nov. 20, 1992, Pat. No. 5,452,238, which is a continuation-in-part of Ser. No. 365,586, Jun. 13, 1989, Pat. No. 5,253,189.

[51] Int. Cl.$^6$ ..................................................... G06F 15/20
[52] U.S. Cl. ................................................................ 395/10
[58] Field of Search ............................ 395/10, 120, 155; 434/302; 364/578

[56] References Cited

U.S. PATENT DOCUMENTS

| | | | |
|---|---|---|---|
| 5,251,290 | 10/1993 | Pabon | 395/120 |
| 5,390,294 | 2/1995 | Takeuchi | 395/155 |
| 5,410,496 | 4/1995 | Bolon et al. | 364/578 |
| 5,412,762 | 5/1995 | Kondo | 395/120 |
| 5,427,531 | 6/1995 | Kramer | 434/302 |
| 5,497,452 | 3/1996 | Shimizu et al. | 395/120 |

*Primary Examiner*—Robert W. Downs
*Assistant Examiner*—Sanjiv Shah
*Attorney, Agent, or Firm*—Charles D. Huston; Danita J. M. Maseles

[57] ABSTRACT

A method, useful in computer-aided design, of identifying possible solutions to an over-constrained system having a collection of entities and constraints. The method represents the entities in terms of degrees of freedom and incrementally assembles the system by adding entities, satisfying constraints and reducing the degrees of freedom of the entities. For an over-constrained system, the method constructs a dependency graph of the system and identifies the set of constraints which over-constrains the system. The over-constraining set includes the constraint which initiated the over-constraint and those constraints back traced in the dependency graph from the initiating constraint. Removal of one or more constraints from the over-constraining set results in a solvable fully or under-constrained system. Intelligent selection of the removed constraint may increase computational efficiency or system stability. The method is useful in diverse constraint satisfaction problems, particularly geometric modeling problems such as describing mechanical assemblies, constraint-based sketching and design, geometric modeling for CAD, and kinematic analysis of robot and linkage mechanisms.

19 Claims, 10 Drawing Sheets

DEPENDENCY GRAPH SOLUTION FOR CONSTRAINT SYSTEMS

This is a Continuation of application Ser. No. 08/053,891 filed Apr. 27, 1993, now abandoned, which is a Continuation-In-Part of 07/979,143 filed Nov. 20, 1992, now U.S. Pat. No. 5,452,238, which is a Continuation-In-Part of 07/365,586 filed Jun. 13, 1989, now U.S. Pat. No. 5,253,189.

FIELD OF THE INVENTION

This invention relates to a method for solving a computer aided design constraint system, particularly an over-constrained system, using a dependency graph of the system.

BACKGROUND OF THE INVENTION

A computer-aided design (CAD) system should account for the dynamic nature of the design process, enabling design modifications while recognizing critical design constraints which should not change. In the past, it was necessary for the CAD engineer to remember the design constraints and relationships and consciously preserve them every time a change is made to the design, increasing both design time and the possibility of error. Maintaining design constraints and relationships is particularly difficult through multiple design changes, particularly with complex pans. Compounding the problem is the fact that even simple designs include hundreds of constraints and all of the design constraints may not be known when a modification is made or attempted. Ideally, a CAD system would allow the engineer to make a design change while maintaining critical constraints, would identify conflicts among the constraints, and possible solutions where the design is over-constrained.

Many design problems can be generally described as constraint satisfaction problems. That is, given a collection of entities and constraints that describe how the entities react and relate to each other, find a configuration of the system so as to satisfy all constraints simultaneously. U.S. Pat. No. 5,452,238 (incorporated by reference) describes a method for finding the possible configurations of a geometric system having a collection of geometric entities that satisfy a set of geometric constraints. U.S. Pat. No. 5,452,238 forms a basis for a geometric constraint engine (GCE) used in a sketching product under development.

GCE finds positions, orientations and dimensions of geometric entities in 3D that satisfy a set of constraints relating different entity features. Geometric entities can be nested hierarchically in a part-whole relationship; aggregate entities are composed of combinations of primitive ones—points, vectors and dimensions.

With the exception of dimensional constraints, all constraints used in GCE are binary constraints—they relate two geometric entities. These constraints may additionally involve real parameters. Examples of constraints used in GCE are shown in Table 1. Dimensional constraints are unary; they relate one geometric entity to a real-valued dimension parameter. Constraints may apply to subparts of a given entity. For example, to constrain two lines to be parallel one constrains the vectors of those lines to have an angle of zero.

TABLE 1

Constraints used in GCE

| Constraint name | Explanation |
| --- | --- |
| dist:point-point($G_1,G_2,d$) | Distance between point $G_1$ and point $G_2$ is d. |
| dist:point-line($G_1,G_2,d$) | Distance between point $G_1$ and line $G_2$ is d. |
| dist:point-plane($G_1,G_2,d$) | Distance between point $G_1$ and plane $G_2$ is d. |
| dist:line-circle($G_1,G_2,d$) | Distance between line $G_1$ and circle $G_2$ is d.[a] |
| angle:vec-vec($G_1,G_2,\alpha$) | Angle between vector $G_1$ and vector $G_2$ is a. |

[a]In two dimensions, d = 0 represents a tangency constraint.

GCE addresses an issue currently outside the major focus of constraint-based systems research: solving highly non-linear constraint problems over the domain of real numbers. To solve these problems, GCE imposes an operational semantics for constraint satisfaction in the geometry domain. It does so by employing a metaphor of incremental assembly; geometric entities are moved to satisfy constraints in an incremental manner. The assembly process is virtual, as geometric entities are treated as ghost objects that can pass through each other during assembly. Such an assumption is allowed because the goal of the constraint satisfaction process is to determine globally-consistent locations of the geometric entities rather than the paths required for a physical assembly of that geometry.

GCE assembles geometric entities incrementally to satisfy the constraints acting on them. As the objects are assembled, their degrees of freedom are consumed by the constraints, and geometric invariants are imposed. An operational semantics is imposed: measurements and actions are used to satisfy each individual constraint. GCE uses information about an entity's degrees of freedom to decide which constraint to solve and to ensure that an action being applied to a geometric entity does not invalidate any geometric invariants imposed by previously-satisfied constraints. This ensures that the solution method is confluent.

GCE can handle fully- as well as under- and over-constrained models. The solution of a set of constraints can be captured as a plan that may be replayed to satisfy the constraints when one or more numerical constraint parameters are changed.

In the GCE context, a constraint model is fully constrained when there are no remaining degrees of freedom after all constraints have been satisfied, and where no constraint in the system is redundant. The constraint model is under-constrained when there are remaining degrees of freedom in the model. Over-constrained models result from adding more constraints to a fully constrained model (or by adding a constraint restricting M degrees of freedom to a model with N remaining degrees of freedom, where M is greater than N).

For a further description of GCE and the use of geometric constraints in kinematics and conceptual design, see, Glenn Kramer, "Solving geometric constraint systems," In Proceedings of the 8th National Conference on Artificial Intelligence, pages 708–714, Boston, Mass., August 1990, American Association for Artificial Intelligence, MIT Press; Jahir Pabon, Robert Young, and Walid Keirouz, "Integrating parametric geometry, features, and variational modeling for conceptual design," Systems Automation: Research and Applications, 2:17–36, 1992; Glenn Kramer, "Solving Geometric Constraint Systems: A Case Study in Kinematics,"

MIT Press, Cambridge, Mass., 1992; Glenn Kramer, "A geometric constraint engine," Artificial Intelligence, 58:327–360, December 1992 (all incorporated by reference for background).

For many real world design problems, it is important to identify and remove a constraint from the over-constrained model so that solution is possible. Further, the designer may want to explore the effects on the model if different constraints are removed or the parameters of a constraint are changed. A method for identifying the set of constraints over-constraining a model and assisting the designer in removing or changing a constraint from the set and analyzing the effect on the system would be a significant aid in evaluating a constraint satisfaction problem.

SUMMARY

The present invention is particularly useful to the designer in solving, debugging, explaining, and optimizing constraint satisfaction problems, particularly where the system is or becomes over-constrained. The method of the present invention constructs a dependency graph describing the constrained relationships between entities, with the constraints and entities represented as nodes in the dependency graph. Alternatively, the entities or constraints may be represented in the graph as nodes and arcs without detracting from the operation of the invention.

When encountering an over-constraining set of constraints in the model, the method of the present invention identifies the over-constraining set of the dependency graph by first identifying the constraint which initiated the system over-constraint and then identifying all the constraints coupled to the initiating constraint by back tracing through the dependency graph. Removing one of the constraints from the over-constraining set results in a fully-constrained or under-constrained model permitting solution of the constraint system. Advantageously, the designer may experiment with removing different constraints from the over-constraining set or changing parameter values to analyze the effects on the system.

The method represents the entities in terms of degrees of freedom to facilitate analysis of the state of the system: under, fully, or over-constrained. Preferably, the entities comprise geometric rigid bodies parametrized by a set of configuration variables which describe translational, rotational, and dimensional degrees of freedom.

Preferably, the constraint node identified for removal or change is selectively chosen. For example, dimensional constraints may be preferably removed or a default set of constraints bounds the selection process.

BRIEF DESCRIPTION OF THE DRAWINGS

FIGS. 2(a)–2(f) illustrate various states of geometric constraint systems where

DESCRIPTION OF THE PREFERRED EMBODIMENTS

1 States of Constraint Models

FIGS. 2(a)–2(f) illustrate the various states of a constraint model. The following notation will be used: $ls_i$ denotes line segment i; $ls_ip_1$ denotes end-point 1 of $ls_i$; $ls_ip_2$ denotes end-point 2 of $ls_i$; $v_i$ denotes the direction vector of $ls_i$. In the examples in FIGS. 2 and 3, a tick mark in the center of a line segment denotes a fixed dimension constraint for the line segment, an arc with label $\alpha_{ij}$ denotes and angle constraint between the vectors of $ls_i$ and $ls_j$, and coincident end-points in the figure indicate a coincidence constraint exists between those end-points. Using this notation, the possible states of a constraint model are now enumerated.

Figure 2A:
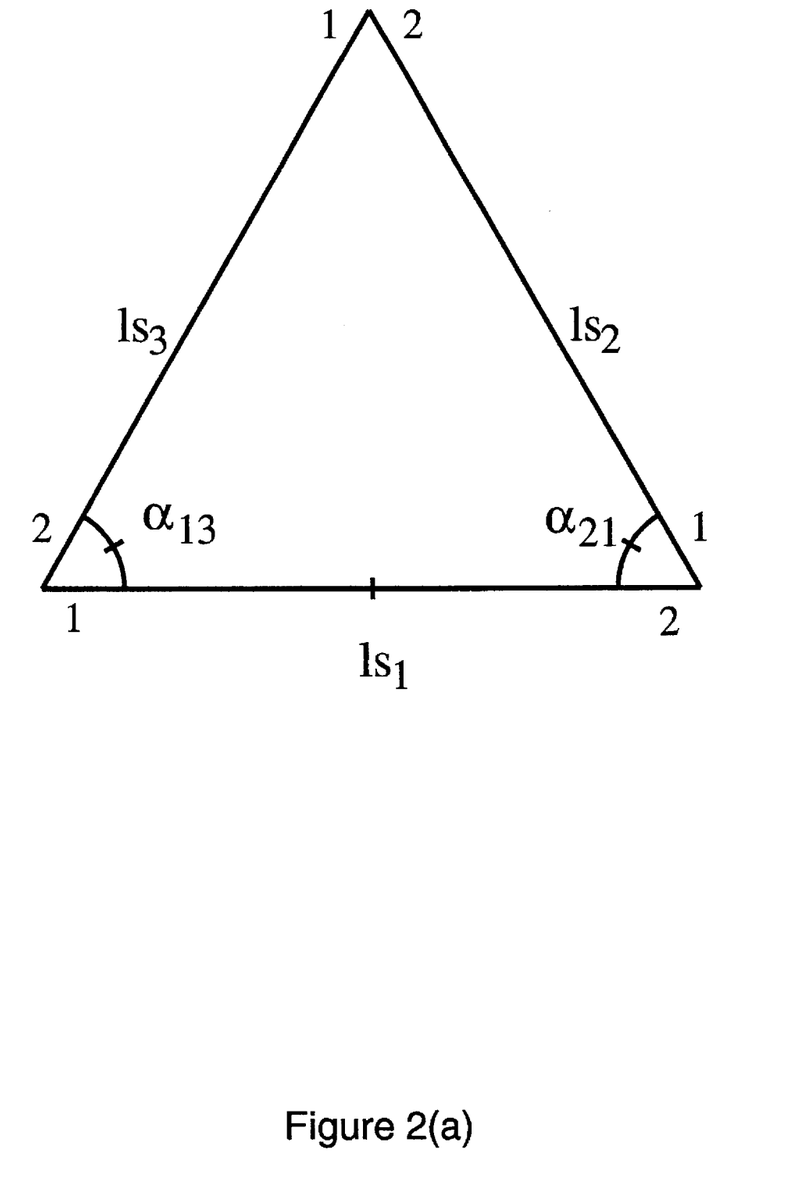
FIG. 2(a) is a fully constrained system.

A constraint model is fully constrained when there are no remaining degrees of freedom after all constraints have been satisfied, and where no constraint in the system is redundant. An example is shown in FIG. 2(a). Here, the length of $ls_1$ is fixed, and two angles are known. This corresponds to using the "angle-side-angle" formula of elementary geometry to find all pans of a triangle.

Figure 2B:
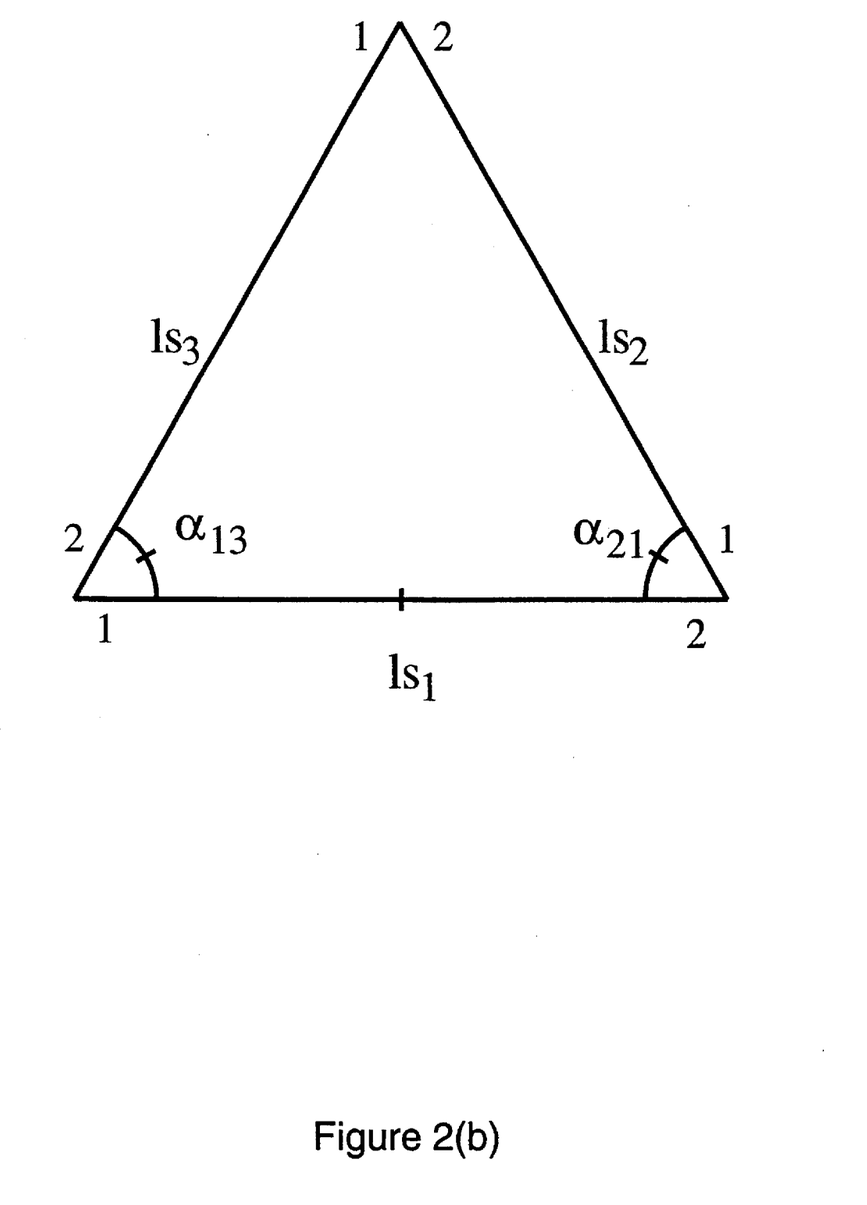
FIG. 2(b) is an under-constrained system.

A constraint model may be under-constrained. FIG. 2(b) is similar to FIG. 2(a) except that the dimension of $ls_1$ has been freed. This example describes an infinite family of "similar" triangles, which can be parameterized by fixing the length of any one of the three line segments.

Figure 2C:
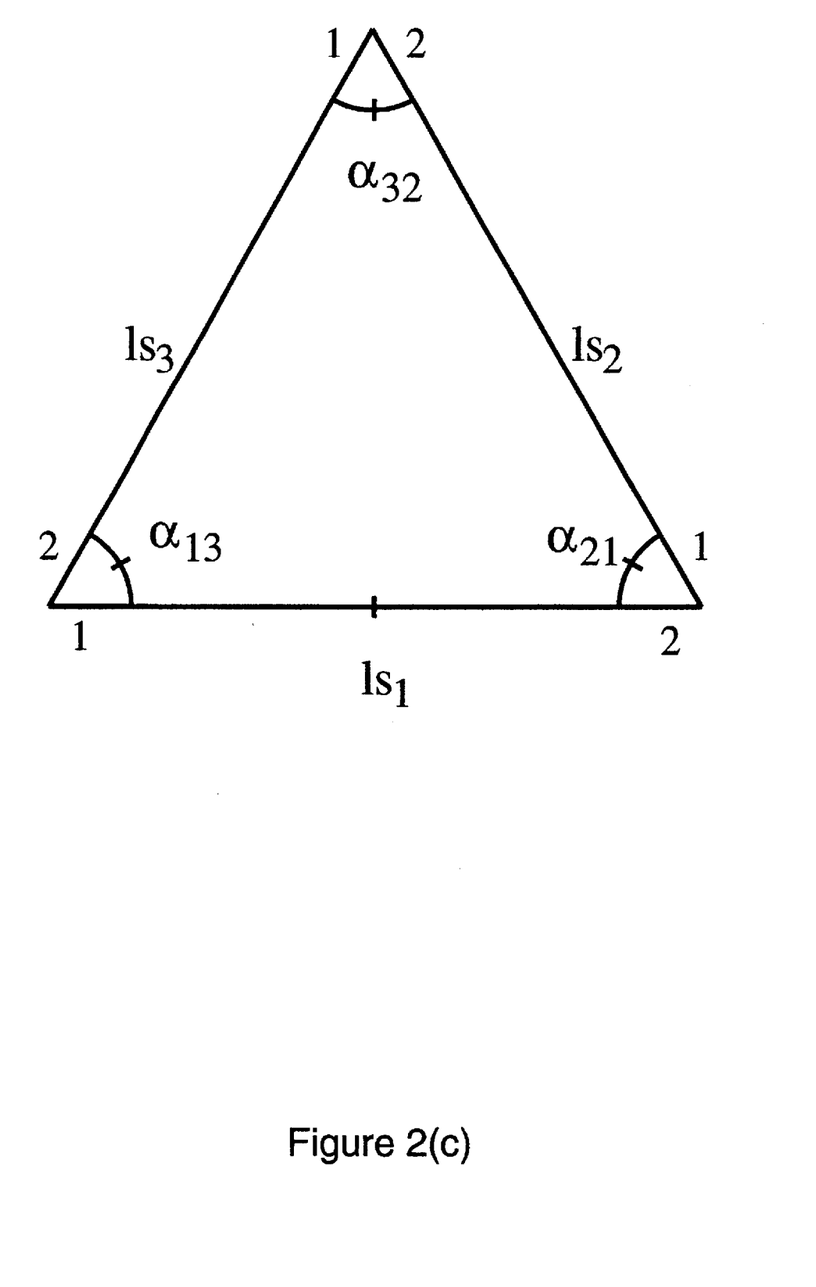
FIG. 2(c) is an over-constrained, but consistent system.

Over-constrained models result from adding more constraints to a fully constrained model (or by adding a constraint restricting m degrees of freedom to a model with n remaining degrees of freedom, where m>n). FIG. 2(c) is similar to FIG. 2(a), except that constraint $\alpha_{32}$ has been added. In this case, $\alpha_{32}$ is chosen $\alpha_{32}=\pi-(\alpha_{13}+\alpha_{21})$, So the model is numerically consistent. Identifying and correctly solving such cases is important in real-world design (e.g., only one hinge is needed to hold a door on a frame in a constraint-based world; the remaining hinges are mathematically redundant, but are quite useful in the physical world).

Figure 2D:
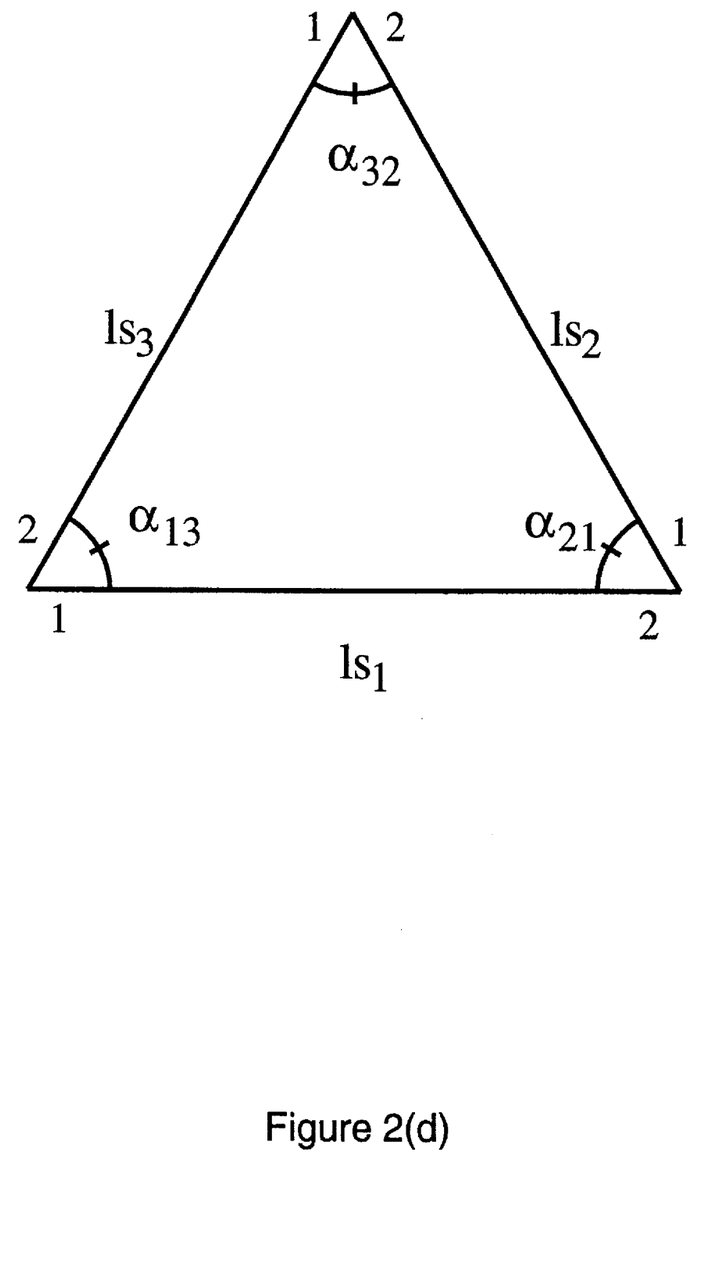
FIG. 2(d) is an over- and under-constrained system.

Over- and under-constrained situations can coexist in the same constraint model. FIG. 2(d) shows such an example. The angles are over-constrained but consistent, as in FIG. 2(a), but the lengths are under-constrained as in FIG. 2(b).

Figure 2E:
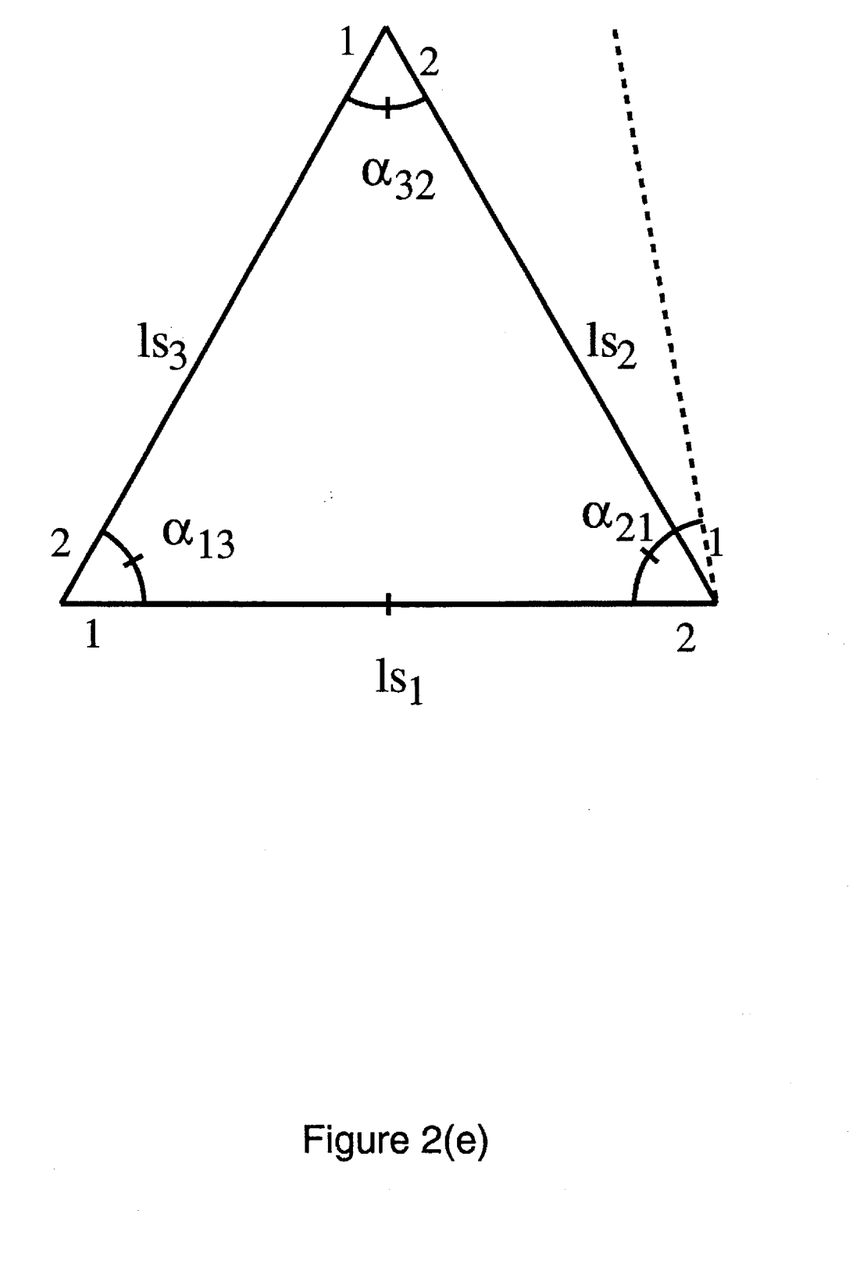
FIG. 2(e) is an over-constrained and inconsistent system.

An over-constrained model can also be inconsistent, as shown in FIG. 2(e). Here, the three angle constraints do not sum to pi. If $\alpha_{13}$ and $\alpha_{32}$ are satisfied, the problem is fully constrained. When $\alpha_{21}$ is asserted, $ls_2$ would need to be rotated to the dashed position to satisfy the new constraint. However, $ls_2$ is already fully constrained and hence cannot move to the new position.

Figure 2F:
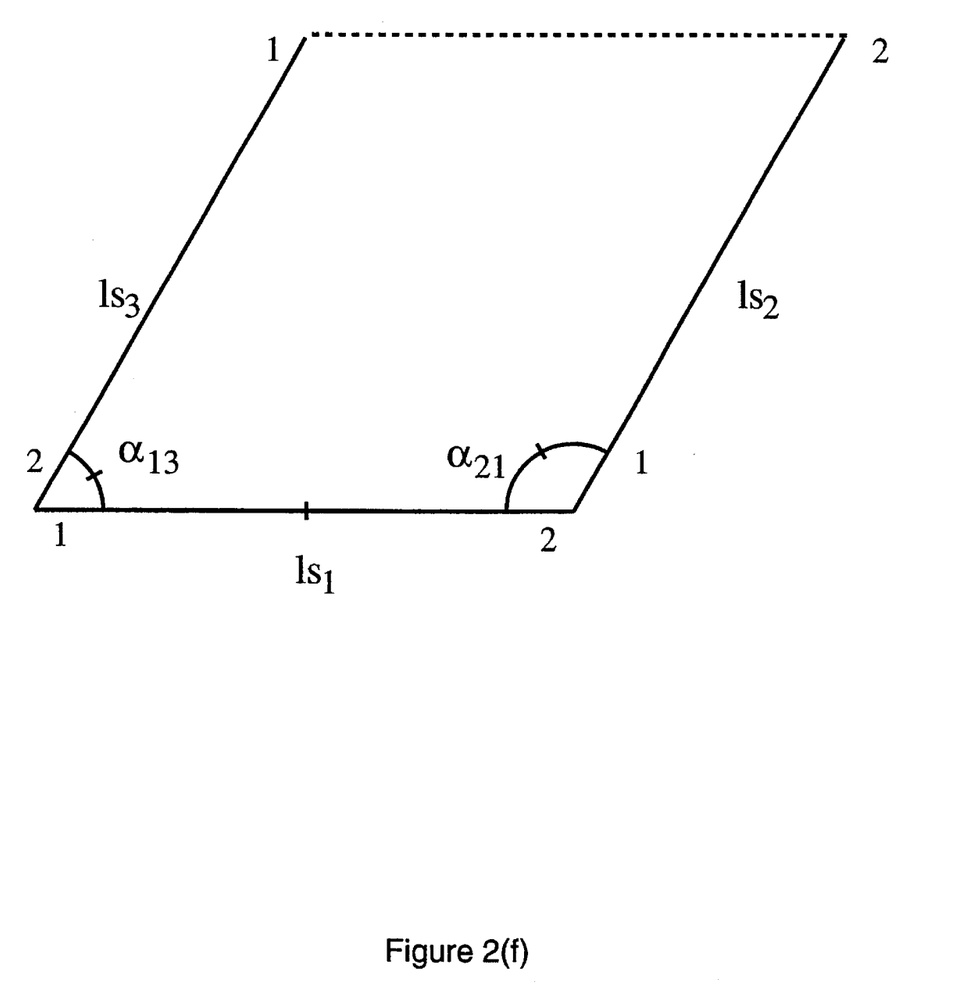
FIG. 2(f) is a numerically unsatisfiable system.

Fully constrained systems can be numerically unsatisfiable, as shown in FIG. 2(f). Here, $\alpha_{13}$ and $\alpha_{21}$ are chosen so that $ls_3$ and $ls_2$, both still of indeterminate length, are parallel. Thus, the desired coincidence constraint between $ls_3p_1$ and $ls_2$, shown as a dashed line, cannot be satisfied. The number of degrees of freedom removed from the system by the constraints is the same as in FIG. 2(a); only the numerical values have changed.

2 Construction of a Constraint Dependency Graph

Figure 1:
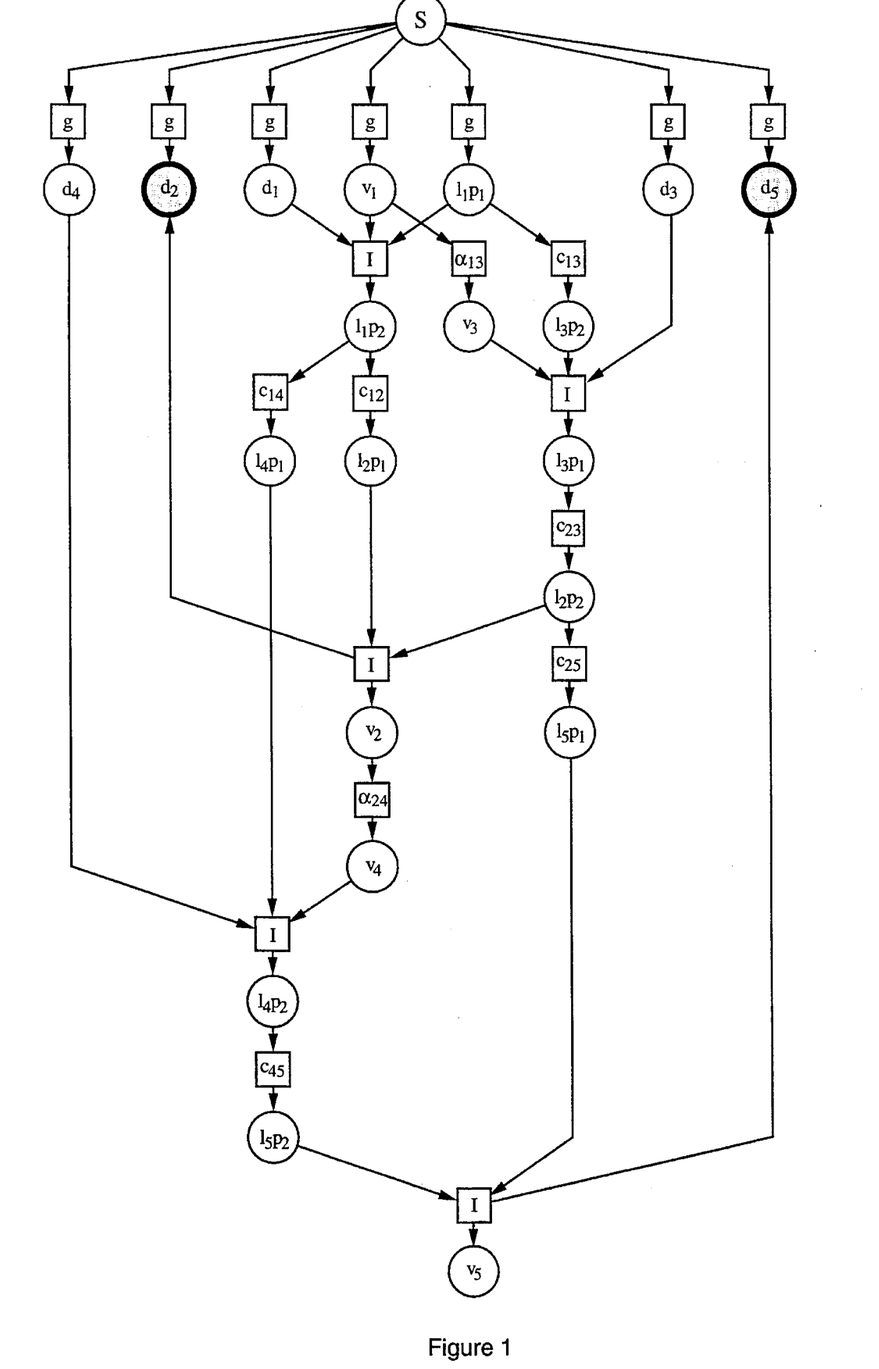
FIG. 1 schematically depicts a dependency graph used in the method of the present invention.
Figure 3:
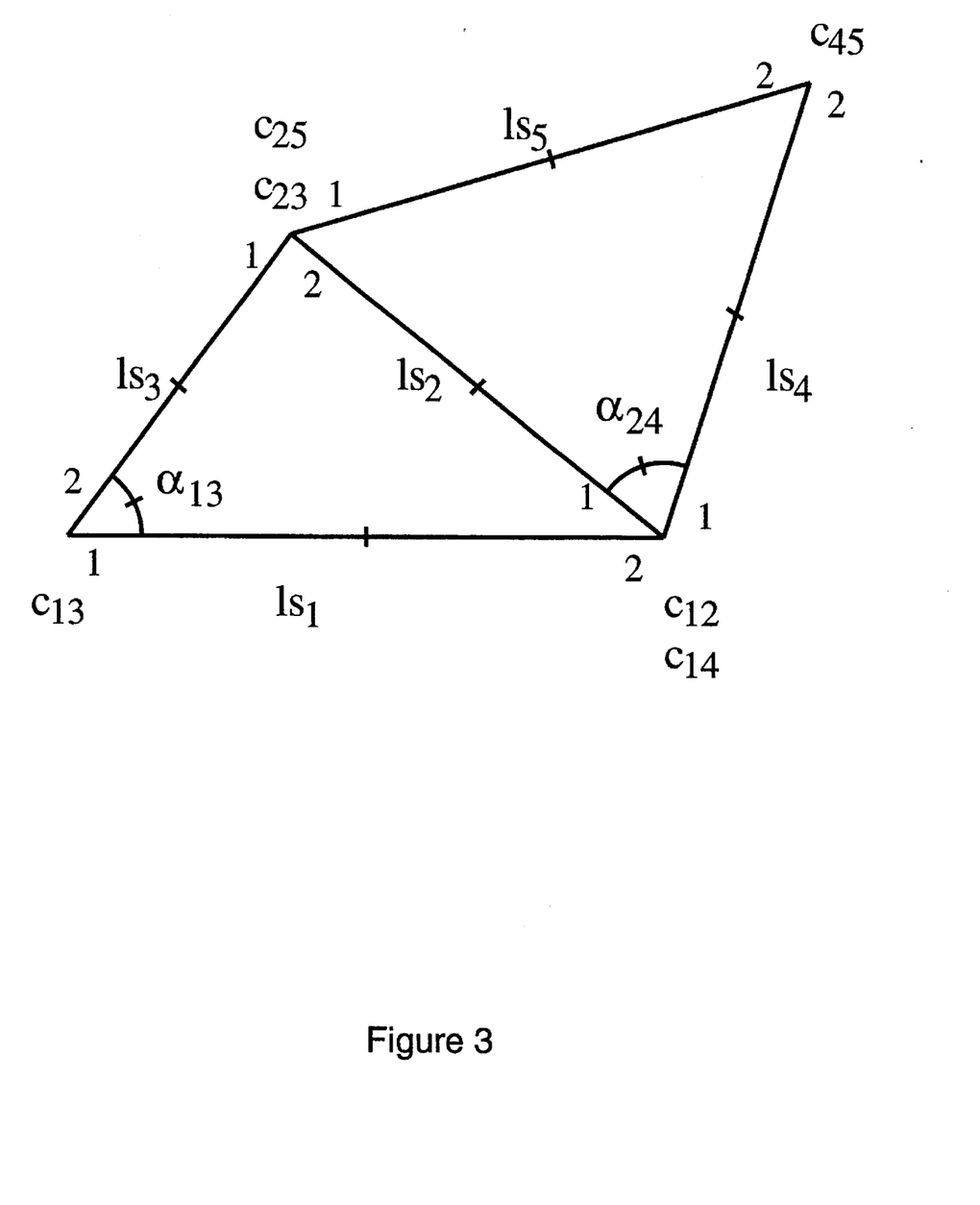
FIG. 3 illustrates an example of an over-constrained model.

Turning now to FIGS. 1 and 3, construction of a dependency graph for an over-constrained model is illustrated. A constraint system's solution method solves the constraints in a "particular" order that respects the dependencies built into the model and captures this order in a solution plan. However, the captured order is one of many possible orders in which the constraints may be solved. Ordering relationships can be extracted from the solution plan and collected into a dependency graph for the constraint model. The solution plan then describes one of several possible traversals of the nodes in the graph.

Dependency graphs provide a mechanism for constraint dependency analysis which supports debugging and explanation, consistency analysis, user interaction, parameterization of models, and computational optimization. In the preferred embodiment, the entities and constraints are each represented as "nodes" in the graph. However, the entities may be represented as nodes and the constraints as arcs connecting nodes (or vice versa) without departing from the scope of the invention.

FIG. 3 shows an over-constrained system or model. The two triangles are fully determined by the coincidence constraints for the line segments' end-points, and by the lengths of the line segments (all of which are fixed). The notation $c_{ij}$ indicates one endpoint of $ls_i$ is coincident with one end-point of $ls_j$; the end-points are numbered in the diagram. $ls_1p_1$ and $v_1$ are fixed in space, which "grounds" the assembly in space. The two angle constraints are then added; these are redundant and lead to over-constraint. While these angle constraints are the direct cause of the over-constraint, removing other constraints could alleviate the problem just as easily.

FIG. 1 shows the dependency graph for the system of FIG. 3. A special node labeled "S" (for "Start"), is the source node. Square nodes indicate constraints, while circular nodes indicate primitive geometric entities whose locations have become known—or fixed—by having been moved to satisfy the constraint immediately preceding it in the graph.

The constraint nodes labeled "g" depict the unary constraints which ground the location of $ls_1p_1$ and the orientation of $v_1$, as well as the dimensions of all the line segments. The $c_{ij}$ and $\alpha_{ij}$ nodes correspond to the constraints in FIG. 3. The square nodes marked "I" denote inference nodes: Since the representation of line segments is redundant, some information can be inferred after a constraint is satisfied. For example, given $ls_1p_1$, $v_1$, and dimension $d_1$, the location of the other end-point $ls_1p_2$ may be inferred.

In this graph, the dimensions $d_2$ and $d_5$ are found through two different paths (one by grounding, and another by inference from other knowns). These nodes indicate two areas of over-constraint in the model. $d_2$ and $d_5$ each have their own over-constraining set of constraints.

3 Finding the Over-Constraining Set

Although over-constraint is directly caused by the addition of a single constraint to a model, several constraints are involved in the situation. The over-constraining set consists of the constraint that "caused" the over-constraint and a subset of the model's constraints that conflict with that constraint, directly or indirectly. Selecting one constraint from this set and removing it (or altering its numerical parameters such that the constraint removes fewer degrees of freedom) from the model reduces the over-constrained state to a fully- or under-constrained one. A potentially different over-constraining set exists for each over-constrained situation within the same model.

EXAMPLE

Dimension $d_2$

Figure 4:
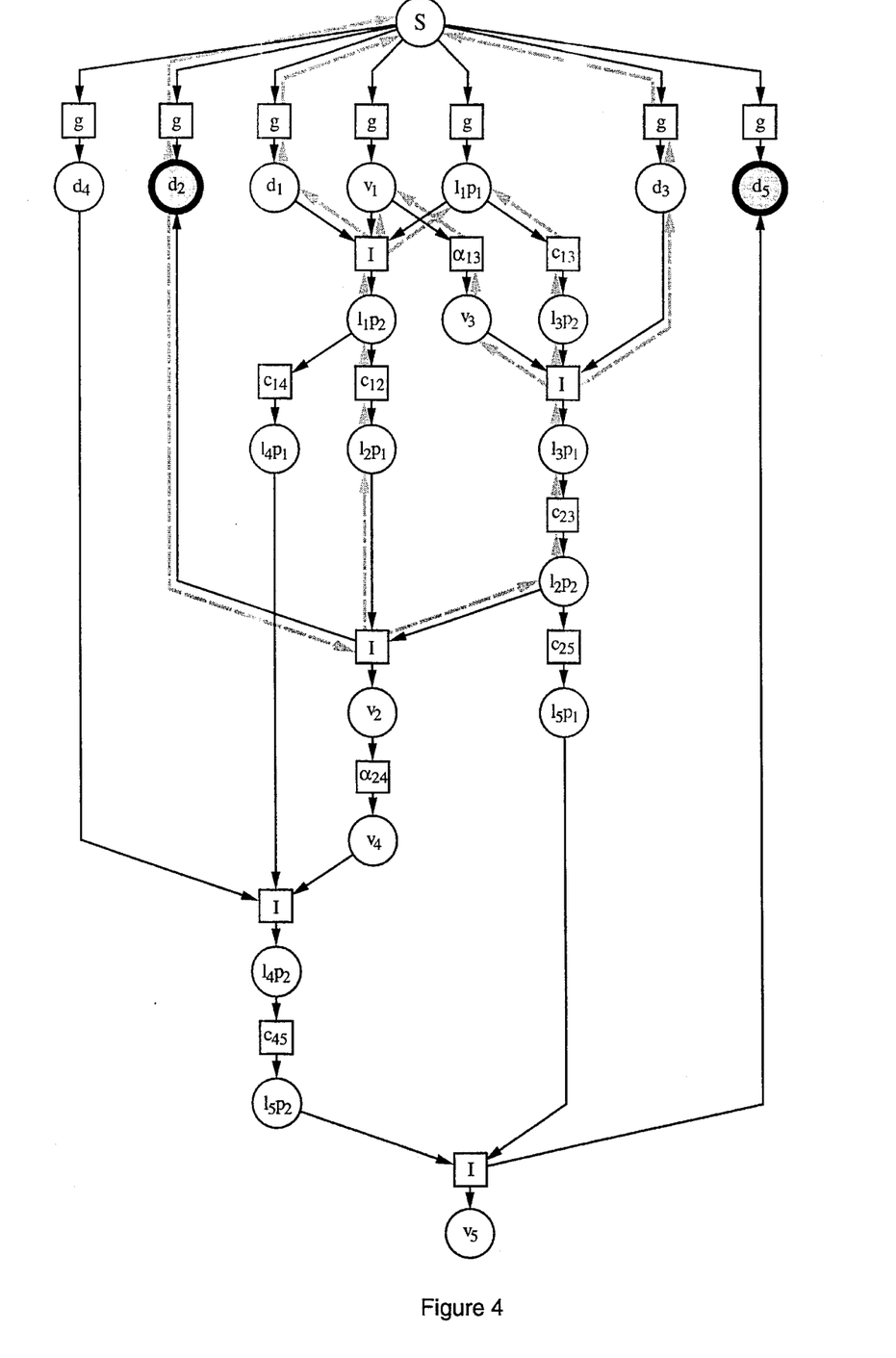
FIG. 4 depicts a dependency graph for finding the over-constraining set of constraints that over determine the dimension $d_2$ of line segment $ls_2$ from FIG. 3.

Consider the case of the twice-determined dimension $d_2$ in FIG. 4. One determination of $d_2$ is the unary constraint g defining dimension $d_2$. Another determination of $d_2$ comes from the inference node that points to $d_2$. That inference node states that if $ls_2p_1$ and $ls_2p_2$ are both known, then $d_2$ and $v_2$ can be determined. If this inference were not possible, then the source of over-constraint would disappear. Thus, $d_2$ is twice-determined as indicated by the solid arrow from g to $d_2$ and the solid arrow from I to $d_2$.

The over-constraining set of constraints is found by "back tracing" or "arc flipping" through the dependency graph. FIG. 4 indicates this by "flipping" the direction of the arc (originally from "I" to $d_2$) to be from $d_2$ to the "I" node. Continuing the reasoning, the inference would not be possible if either $ls_2p_1$ were unknown or $ls_2p_2$ were unknown. This is indicated by flipping both arcs. Continuing backward from $ls_2p_1$, this point's location would not be known if $ls_1p_2$ were unknown, so removing the coincident constraint $c_{12}$ would alleviate the over-constraint.

This chain of reasoning continues back through $d_1$, but not through $v_1$ or $ls_1p_1$. The reason is due to the fan out at those nodes, where information is used in two separate chains of constraint solution, and where this information is recombined by an inference node later on. The concept is analogous to the notion of reconvergent fan out in the digital test generation literature, see, Melvin A. Breuer and Arthur Friedman, "Diagnosis and Reliable Design of Digital Systems," Computer Science Press, Rockville, Md., 1976 (incorporated for background). The method for back tracing through the dependency graph to find the over-constraining set is then as follows:

1. Beginning with the node at which the over-constraint is detected (i.e., the node which has two arcs leading to it), flip the arcs backward through the next set of nodes.

2. Continue flipping the arcs backward until a node is reached where there is reconvergent fan out (such a node is guaranteed to exist due to the existence of node "S").

3. All constraints for which both input and output arcs are members of the set of flipped arcs are members of the over-constraining set. The over-constraining sets for the graph of FIG. 1 depicted in FIG. 4. The set in long dashes corresponds to the constraints that over-determine $d_2$. As can be seen from FIG. 4, the over-constraining set for $d_2$ is: $g(d_2)$, $c_{12}$, $g(d_1)$, $c_{23}$, $\alpha_{13}$, $c_{13}$, and $g(d_3)$,

EXAMPLE

Dimension $d_5$

Figure 5:
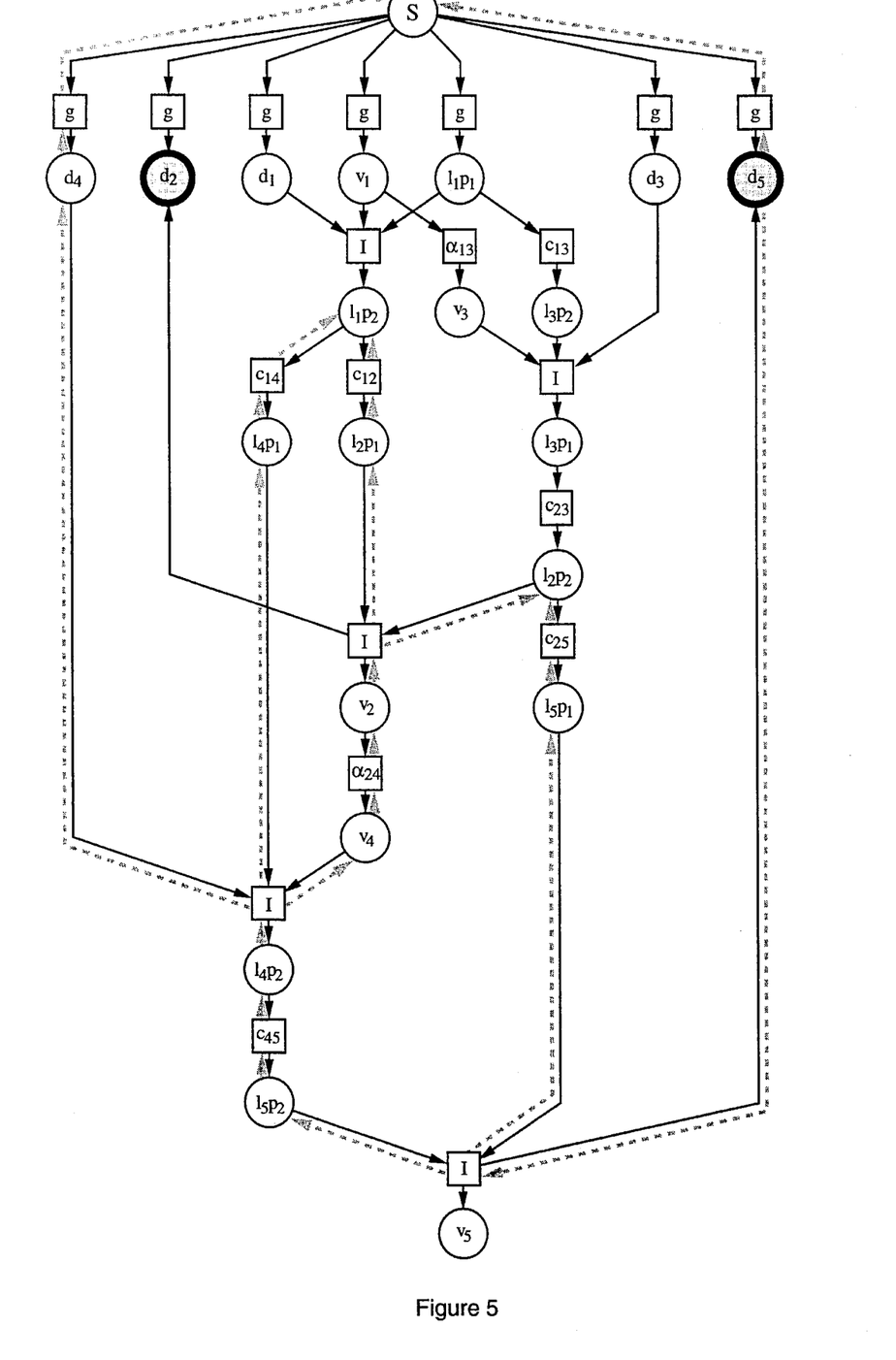
FIG. 5 illustrates the solution for finding the over-constraining set of constraints that over determine dimension $d_5$ of line segment $ls_5$ in FIG. 3.

FIG. 5 illustrates the procedure for finding the constraining set of constraints for the twice-determined dimension $d_5$. The set of short dashes corresponds to the constraints that over-determine $d_5$. FIG. 5 is analogous to FIG. 4, that is, the back tracing method for finding the over-constraining set is:

1. Beginning with the node at which the over-constraint is detected (i.e., the node which has two arcs leading to it, in this case $d_5$), flip the arcs backwards through the next set of nodes.

2. Continue flipping the arcs backwards until a node is reached where there is reconvergent fan out.

3. All constraints for which both input and output arcs are members of the set of flipped arcs are members of the over-constrained set.

In the present application this procedure is generally referred to as "back tracing" through the dependency graph.

As shown in FIG. 5, the over-constraining set for $d_5$ is: $g(d_5)$, $c_{25}$, $c_{45}$, $\alpha_{24}$, $c_{12}$, $c_{14}$, and $g(d_4)$.

Explanation

The over-constraining sets for the system of FIG. 3 are depicted in FIGS. 4 and 5. The set in long dashes corresponds to the constraints that over-determine $d_2$ (FIG. 4). The set in short dashes corresponds to the constraints that over-determine $d_5$ (FIG. 5). Note that the reconvergent fan out termination criterion for arc flipping is considered separately for each over-constraining set, i.e., two flipped arcs, one from the $d_2$ set and one from the $d_5$ set, do not interact and hence are not reconvergent.

Also note that the over-constraint of $d_5$ has no dependence on $d_2$, although the over-constraining sets have members in common. One might conclude that, since $ls_2$ is a pan of triangle $<ls_1, ls_2, ls_3>$ (call it T1) and that triangle T1 depends on triangle $<ls_2, ls_4, ls_5>$ (call it T2), that the over-constraint of T2 would be dependent on everything in T1. However, a closer examination of the particular constraints shows that, even if $d_2$ were not specified, the location of $ls_2p_2$ would be found. Also, T2 is not dependent on $ls_2p_2$ at all; rather it is dependent on the location of $ls_1p_2$, to which $ls_2p_1$ is made coincident.

Some of the constraints identified may remove more degrees of freedom than occur in the over-constrained situation; removing such a constraint would result in an under-constrained model. For example, the over-determination of $d_2$ indicates over-constraint of one degree of freedom. Thus, removing an angle constraint like $\alpha_{13}$ removes the over-constraint, but removing a coincidence constraint such as $c_{12}$ removes two degrees of freedom, leading to under-constraint. To avoid this, the preferred embodiment suggests altering the constraint to require a non-zero distance between $ls_1p_2$ and $ls_2p_1$, which relaxes one degree of freedom.

From a theoretical point of view, all the constraints in an over-constraining set are candidates for removal from a model. However, these sets may need to be filtered depending on the context. For example, in the geometric constraint models of the preferred embodiment, constraints that reflect topological relationships (e.g., coincident-points constraints) have precedence over constraints that specify dimensions.

4 Extensions and Use

Since a constraint solution plan is a procedural program that is generated automatically, tools assist users in understanding what the program does and how it was generated. One such tool is a plan debugger which provides facilities found in debuggers for procedural programming languages: stepping forward and backward, setting breakpoints, and examining the status of constraints and constrained entities.

A plan debugger uses the already-generated plan to allow a user to replay the plan in single-step mode and review the choices made by the constraint solver when it was generating the plan. The constraint solver may be able to solve more than one constraint at a time, but "arbitrarily" chooses one of the possible constraints at each choice point. These choices reflect the fact that a plan is one possible traversal of the dependency graph. A user may also explore alternative traversals of the dependency graph by modifying the choices made by the constraint solver. Exploring alternative solution orders may give the user insight into the nature of conflicting or unsatisfiable constraints. The debugger calls on the solver to add a new branch to the plan if the user's new choice has not been explored before.

The debugger preferably contains an explanation facility that reviews the solution steps and the choices made by the system to explain to the user an interim solution state and how that state was reached.

The dependency graph of a constraint model specifies a partial order for satisfying the constraints in the model. This partial order can be used to parallelize the solution of the constraint model. Subgraphs in a dependency graph, which correspond to subplans in the solution, can be traversed in parallel and provide coarse grain parallelism. As in dataflow models of parallelism, fine grain parallelism can be identified because the solution of a constraint may proceed as soon as its predecessors in the dependency graph have been satisfied.

The dependency graph may also be used to minimize regeneration of a solution plan when a constraint is added or removed from a model. Graph traversal algorithms can identify portions of the dependency graph that are not affected by the addition or removal of a constraint from a model. The new solution plan reuses the unaffected portion of the previous solution plan (i.e., the unaffected constraints are satisfied) and proceeds to solve the remaining constraints.

We claim:

1. In a digital computer programmed generally for computer-aided design, a method of generating a solution plan for a geometric constraint system comprising a collection of rigid body geometric entities satisfying a set of constraints, where the set of constraints over-constrain the system, comprising the steps of:

representing the rigid body geometric entities in terms of degrees of freedom;

incrementally satisfying constraints and systematically reducing the degrees of freedom of the system;

adding a constraint to the geometric constraint system reducing the degrees of freedom and resulting in an over-constrained system;

identifying the over-constraining set of constraints by
(i) constructing a dependency graph describing the constrained relationships between entities;
(ii) identifying the constraint which initiated system over-constraint,
(iii) identifying the constraints coupled to the initiating constraint by back tracing through the dependency graph, the set of identified constraints comprising the over-constraining set; and generating a solution plan by altering one or more constraints from said over-constraining set.

2. The method of claim 1, where the geometric rigid bodies are parameterized by a set of configuration variables and the configuration variables describe translational, rotational, and dimensional degrees of freedom.

3. The method of claim 1, said solution plan comprising the solution steps taken to incrementally satisfy the constraints in the system.

4. The method of claim 3, including the steps of changing one or more numerical constraint parameters in reusing the solution plan to solve the constraint system by satisfying the constraints.

5. The method of claim 1, the generating step including identifying a constraint for removal from said over-constraining set by selecting from a set of default constraints.

6. The method of claim 1, the generating step including identifying a constraint for removal from said over-constraining set where removal of the identified constraint results in a fully constrained system.

7. The method of claim 1, the generating step including identifying a constraint for removal from said over-constraining set by removing one or more dimensional constraints.

8. The method of claim 1, the generating step including identifying a constraint for removal from said over-constraining set by selecting from a subset of inconsistent constraints.

9. The method of claim 1, including the step of identifying subgraphs in the dependency graph and solving the constraints in each subgraph in parallel.

10. The method of claim 1, including the steps of removing a constraint from the system, identifying portions of the dependency graph that are not affected by the removal of a constraint, and regenerating a solution plan for only the affected portions.

11. The method of claim 1, said altering step comprising removing said one constraint from the system.

12. The method of claim 1, said altering step comprising changing the parameter value of said one constraint.

13. The method of claim 1, including the step of analyzing the system comprising the substeps of replacing said one constraint and removing another constraint from said set.

14. In a digital computer, a method of determining a solution plan of a geometric constraint system comprising a collection of geometric entities satisfying a set of constraints where the geometric constraint system is over-constrained, comprising the steps of:

a. representing the geometric entities with configuration variables describing translational, rotational, and dimensional degrees of freedom;

b. constructing a dependency graph with constraints and entities represented as nodes;

c. identifying the set of constraints which over-constrain the system by beginning with the over-determined entity node where system over-constraint was detected and identifying the coupled constraint nodes that over determine the beginning entity node by back tracing through the dependency graph;

d. altering one of the constraints from the set of constraints reducing the system from over-constraint; and e. building a solution plan of the system as one traversal path of the nodes of the dependency graph after removal of said one constraint.

15. The method of claim 14, said altering step comprising removing said one constraint from the system.

16. The method of claim 14, said altering step comprising changing the parameter value of said one constraint.

17. The method of claim 14, where said altering step comprises removing said one constraint, including the step of analyzing the system comprising the substeps of replacing said one constraint and removing another constraint from said set.

18. A digital computer programmed generally for computer-aided-design and specially programmed for determining a solution plan for a geometric constraint system where the geometric constraint system comprises a collection of geometric rigid body entities satisfying a set of constraints and the set of constraints over-constrains the geometric constraint system, comprising:

means for representing the geometric rigid body entities with configuration variables which describe translational, rotational, and dimensional degrees of freedom;

means for identifying the over-constraining constraints which includes
      means for constructing a dependency graph for describing the constrained relationships between entities;
      means for identifying the constraint which initiated the system over-constraint,
      means for identifying the constraints coupled to the initiating constraint by back tracing through the dependency graph the identified over-constraining constraint; and means for generating a solution plan by altering one or more constraints from said over-constraining set reducing the system from over-constraint.

19. The digital computer of claim 18, including a display for displaying the solution plan.

* * * * *